United States Patent [19]

Yoshio

[11] Patent Number: 5,778,911
[45] Date of Patent: Jul. 14, 1998

[54] LIQUID SUPPLYING APPARATUS

[75] Inventor: Akira Yoshio, Shizuoka, Japan

[73] Assignee: Sony Disc Technology Inc., Japan

[21] Appl. No.: 539,265

[22] Filed: Oct. 4, 1995

[30] Foreign Application Priority Data

Oct. 13, 1994 [JP] Japan ................. 6-275954

[51] Int. Cl.[6] ........................................... B08B 13/00
[52] U.S. Cl. .................... 134/104.2; 134/902; 134/111;
222/109; 222/110; 222/111; 239/121; 137/312
[58] Field of Search ................. 134/105, 902,
134/155, 186, 108, 109, 111, 104.2; 239/119,
120, 121, 122; 118/302, 326, 319, 323,
321; 137/312, 596.2; 396/627, 611; 222/104,
110, 111

[56] References Cited

U.S. PATENT DOCUMENTS

| | | | |
|---|---|---|---|
| 1,674,668 | 6/1928 | Spaeth | 222/109 |
| 3,087,517 | 4/1963 | Magnuson et al. | 222/109 |
| 3,749,313 | 7/1973 | Weitman | 118/321 |
| 4,190,015 | 2/1980 | Hillman | 118/321 |
| 4,254,644 | 3/1981 | Bartlett et al. | 68/205 R |
| 4,277,080 | 7/1981 | Fox | 68/205 R |
| 4,546,280 | 10/1985 | Fukuda | 134/902 |
| 4,644,983 | 2/1987 | Bishop | 222/109 |
| 4,745,422 | 5/1988 | Matsuoka et al. | 134/902 |
| 4,923,743 | 5/1990 | Stewart, Jr. | 68/205 R |
| 4,926,514 | 5/1990 | Leuenberger | 68/205 R |
| 5,063,758 | 11/1991 | Keller et al. | 68/205 R |
| 5,201,958 | 4/1993 | Breunsbach et al. | 134/902 |
| 5,273,192 | 12/1993 | Kamiya . | |
| 5,275,658 | 1/1994 | Kimura | 118/321 |
| 5,289,222 | 2/1994 | Hurtig | 396/627 |
| 5,488,964 | 2/1996 | Murakami et al. | 134/902 |

FOREIGN PATENT DOCUMENTS

| | | | |
|---|---|---|---|
| 5-62962 | 3/1993 | Japan | 134/902 |
| 5-166773 | 7/1993 | Japan | 134/902 |

Primary Examiner—Frankie L. Stinson
Attorney, Agent, or Firm—Ronald P. Kananen

[57] ABSTRACT

A liquid supplying apparatus for supplying treatment liquid to a treatment liquid ejecting unit which ejects treatment liquid to a work, which is capable of supplying high quality treatment liquid without wasting treatment liquid. Since a fixed quantity of treatment liquid is ejected from the treatment liquid ejecting unit during the process waiting time and this treatment liquid is ejected through a cup sealed airtight to a liquid tank and circulated, the liquid supplying apparatus capable of supplying high quality treatment liquid can be realized without wasting treatment liquid.

14 Claims, 2 Drawing Sheets

5,778,911

1

LIQUID SUPPLYING APPARATUS

BACKGROUND OF THE INVENTION

1. Field of the Invention

The present invention relates to a liquid supplying apparatus and is suitably applied to the liquid supplying apparatus for supplying treatment liquid to a nozzle when washing and developing an original optical disc and a semiconductor wafer by the treatment liquid ejected from the nozzle for example.

2. Description of the Related Art

An apparatus for washing and developing an original optical disc and a semiconductor wafer by means of ejecting the treatment liquid to the original optical disc and the semiconductor wafer, a liquid ejecting apparatus 1 as shown in FIG. 1 has been proposed. More specifically, the liquid ejecting apparatus 1 chucks to a work 4, such as the original optical disc and semiconductor wafer by means of a turn table 3 installed in a chamber 2 rotates the work 4.

At this point, washing and developing of the work 4 can be conducted by ejecting the treatment liquid 6 to the work 4 from a nozzle 5. For example, if pure water is ejected from the nozzle 5 as the treatment liquid 6, pure water washing of the work 4 can be conducted.

In practice, in the liquid ejecting apparatus 1, a plurality of nozzles 5 which eject various different types of treatment liquids respectively are installed. By properly selecting a nozzle 5 placed on the upper part of the work 4, treatments using various medical fluids can be conducted in addition to the washing treatment.

More specifically, if the nozzle to eject HMDS would be selected as the nozzle 5 to be arranged on the upper part of the work 4, a resist can be applied to the surface of the work 4. If the nozzle to eject a silane coupling lotion would be selected as the nozzle 5 to be arranged on the upper part of the work 4, the surface treatment to improve adhesive power on the surface of the work 4 could be conducted.

However, in the liquid ejecting apparatus 1, since the point of the nozzle 5 dries out during waiting time, there occurs a problem is that solids appear and the concentration of the treatment liquid 6 changes.

Furthermore, there are other problems in that the treatment liquid 6 changes in quality and is polluted by such as oxygen, water, carbon dioxide, bacteria, and the like, in the air leaking in from the point of nozzle 5.

Moreover, in the case where the temperature of the treatment liquid 6 is controlled at a high temperature or a low temperature, since the temperature changes during the waiting time and approaches to the room temperature, the treatment using the treatment liquid 6 with the desired temperature could not be conducted.

Furthermore, when pure water is used as the treatment liquid 6, flow of the treatment liquid 6 stops during the waiting time, and bacteria proliferates in a pipe through the nozzle 5 (not shown), impurities enter from the pipe, or carbon dioxide enters from the point of the nozzle 5 and the quality of pure water changes.

In the liquid ejecting apparatus 1, in order to avoid these problems in advance, the nozzle 5 is moved to the position shown by a point chain line in the chamber 2 immediately before the process. There, the fixed quantity of the treatment liquid 6 is thrown away or a small quantity of the treatment liquid 6 is thrown away constantly during the waiting time at the home position (not shown) arranged outside of the chamber 1 in order to cope with the above problems. In this

2 connection, a drain pipe 7 is provided to drain the treatment liquid 6, and an exhaust pipe 8 exhausts gas such as nitrogen gas entered in the chamber 2 to keep the environment of inside of the chamber 2 at optimal conditions.

However, according to the foregoing arrangements, since expensive treatment liquids are thrown away, the cost increases as well as the load on the drainage processing increases.

Moreover, there exist other problems to keep the quality of the treatment liquid 6 satisfactory.

SUMMARY OF THE INVENTION

In view of the foregoing, an object of this invention is to provide a liquid supplying apparatus capable of supplying a high quality the treatment liquid without needlessly wasting the treatment liquids.

The foregoing object and other objects of the invention have been achieved by the provision of a liquid supplying apparatus 10 for supplying the a treatment liquid 6 to treatment liquid ejecting means 11 which ejects the treatment liquid 6 to the work 4 to be treated, comprising circulation means 11 to 20 for circulating the treatment liquid 6 to be ejected by the treatment liquid ejecting means 11 and giving to the treatment liquid ejecting means 11 again at the time when the treatment liquid ejecting means 11 does not eject the treatment liquid 6 to the work 4 to be treated.

Furthermore, according to the present invention, the circulation means, comprises a cup 12 for receiving the treatment liquid 6 to be ejected from the treatment liquid ejecting means 11; a treatment liquid storage tank 16 for introducing the treatment liquid 6 received at the cup 12; a heater 17 stored in the treatment liquid storage tank 16, for controlling the treatment liquid 6 at the desired temperature; and wherein the treatment liquid 6 ejected from the treatment liquid ejecting means 11 is given again to the treatment liquid ejecting means 11 through the cup 12 and the treatment liquid storage tank 16.

Moreover, according to the present invention, the treatment liquid ejecting means 11 provides a nozzle 11C for ejecting treatment liquid 6, a flange 11A installed extending sideward of the nozzle 1C, and sealing materials 11B arranged on the position facing to the cup 12 of the flange 11A, and seals the inside of cup 12 airtight in case of ejecting the treatment liquid 6 to the cup 12.

Since the circulation means 11 to 20 for circulating the treatment liquid 6 ejected by the treatment liquid ejecting means 11 and giving it again to the treatment liquid ejecting means 11 at the time when the treatment liquid ejecting means 11 is not ejecting the treatment liquid 6 to the work 4 to be treated are equipped, the treatment liquid 6 can be reused without wasting it. At this time, since the treatment liquid 6 is being circulated, the treatment liquid 6 can be prevented from appearing of solids and changing the concentration of treatment liquid.

Furthermore, the nozzle 11C for ejecting the treatment liquid 6, the flange 11A installed extending sideward of the nozzle 11C, and the sealing materials 11B arranged at the position facing to the cup 12 of the flange 11A are provided and the inside of the cup 12 is sealed airtight in the case of ejecting treatment liquid 6 to the cup 12, so that the change in quality of the treatment liquid 6 caused by exposure to the air can be avoided and better treatment liquid 6 can be supplied.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1:
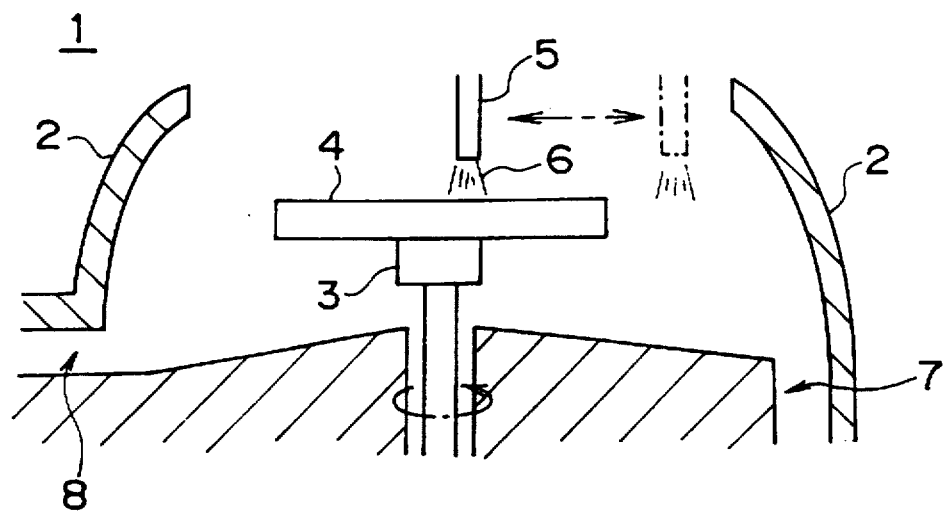
FIG. 1 is a schematic diagram showing the construction of a liquid ejecting apparatus.
Figure 2:
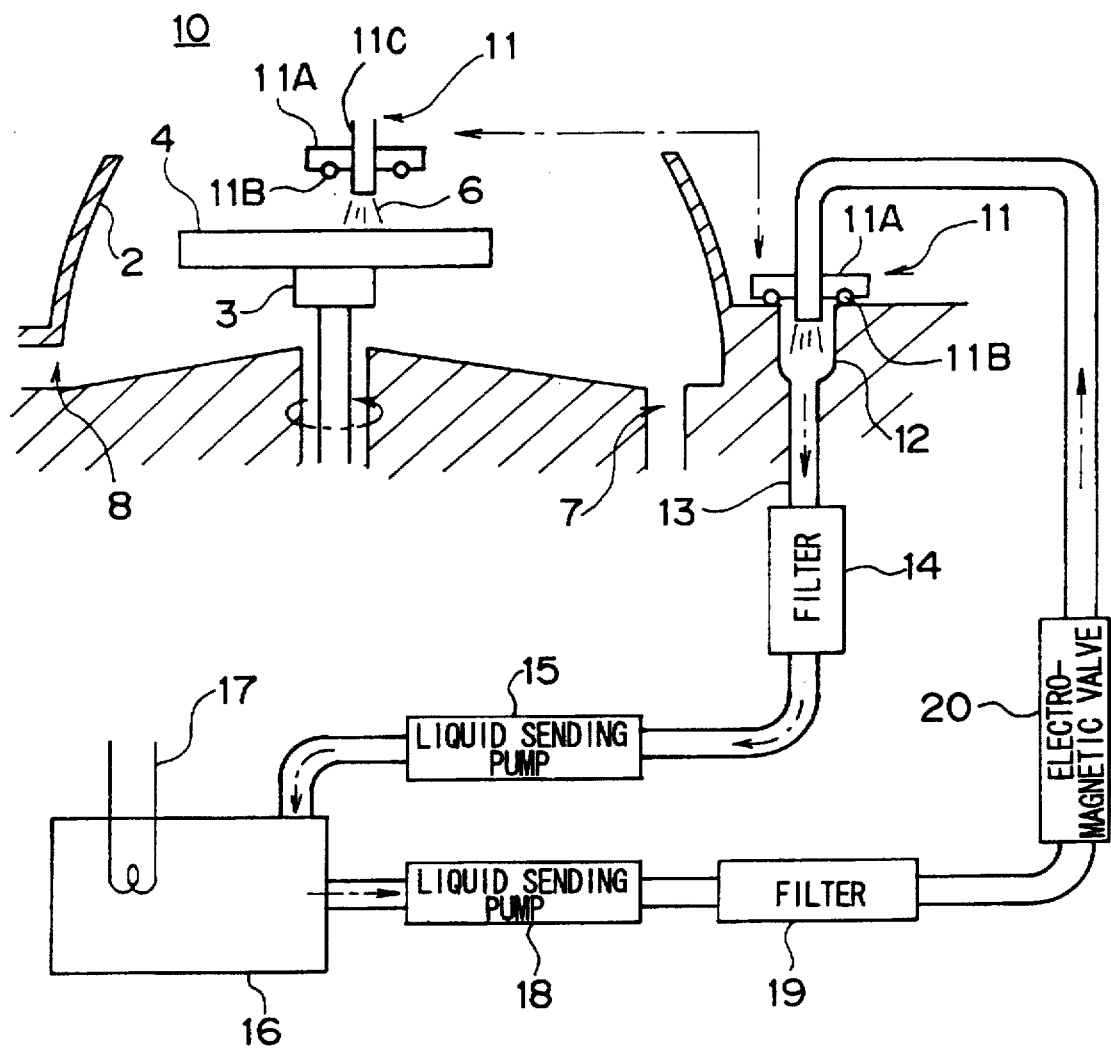
FIG. 2 is a schematic diagram showing a construction of an embodiment of the liquid supplying apparatus according to the present invention.

Preferred embodiments of this invention will be described with reference to the accompanying drawings:

In FIG. 2 in which corresponding parts of FIG. 1 are given the same reference numerals, a liquid supplying apparatus is shown generally at the reference numeral 10. The treatment liquid ejecting unit 11 is attached to a prescribed swing arm (not shown) and arranged to be movable between a liquid ejecting position of the upper part of a work 4 and a home position outside of a chamber 2.

A circulation cup 12 is installed at the home position and the treatment liquid 6 received by the circulating cup 12 is output to a liquid tank 16 through a drain pipe 13, through a filter 14, and a liquid sending pump 15. Thus, the liquid supplying apparatus 10 can effectively reuse the treatment liquid 6 output in the home position without needlessly throwing it away.

A heater 17 is arranged in the liquid tank 16. The treatment liquid, adjusted to the desired temperature in the liquid tank 16, is supplied again to the treatment liquid ejecting unit 11 through a liquid sending pump 18, a filter 19, and an electromagnetic valve 20.

With this arrangement, a high quality treatment liquid 6 having its temperature constantly adjusted and filtered is ejected from the treatment liquid ejecting unit 11.

Figure 3:
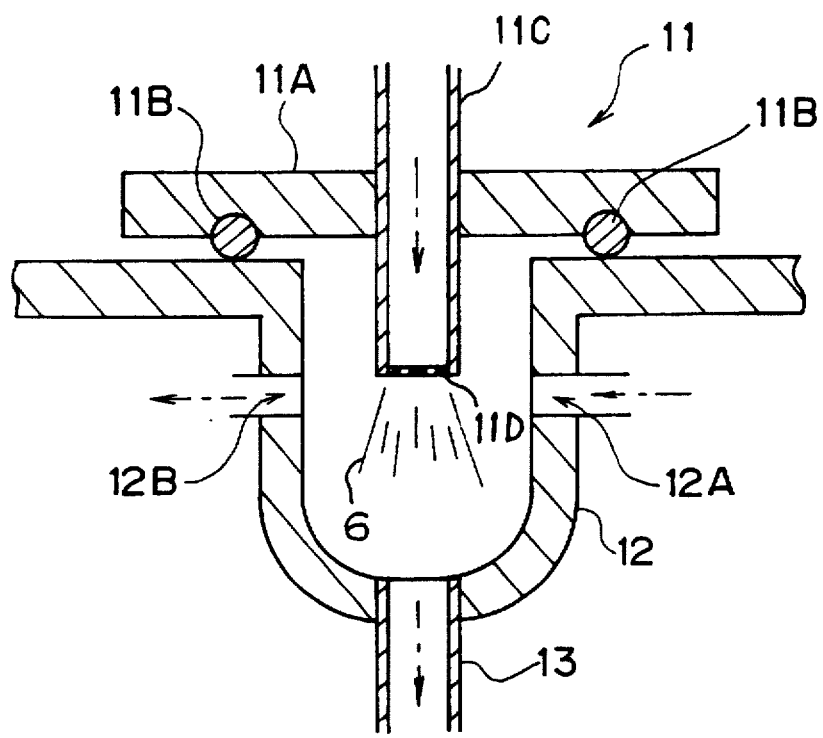
FIG. 3 is a cross sectional diagram showing the construction of the treatment liquid ejecting unit and circulation cup.

Here, the treatment liquid ejecting unit 11 and the circulation cup 12 are constructed as shown in FIG. 3. More specifically, a disc shaped flange 11A extending sideward of a nozzle 11C is installed in the vicinity of the point of the nozzle 11C of the treatment liquid ejecting unit 11. A ring shaped O-ring 11B is attached to the flange 11A.

Accordingly, in the treatment liquid ejecting unit 11, when moved to the home position, the O-ring 11B attaches tightly on the surface of the circulation cup 12 and an airtight space is formed between the flange 11A and the circulation cup 12. As a result, the treatment liquid 6 ejected from the point of the nozzle 11C is output to the drain pipe 13 without exposing the liquid to the air.

Furthermore, the circulation cup 12 is connected with a ventilation pipe 12A and an exhaust pipe 12B nitrogen gas is introduced from the ventilation pipe 12A, while inactive gas is exhausted through the exhaust pipe 12B. Thus, a change in quality of the treatment liquid 6 can be prevented where the treatment liquid 6 is composed of pure water, HMDS or a silane coupling lotion which are apt to be changed in quality by reacting to such as moisture in the air.

At this point, materials of the nozzle 1C, the flange 11A, the cup 12, and the drain pipe 13 may be properly selected among stainless steel, vinyl chloride, nylon, teflon, polyethylene, polypropylene, and so forth, according to the type of treatment liquid 6.

Moreover, aside from the above construction, a mesh 11D is formed at the point of the nozzle 11C. With this arrangement, liquid droppage stops well when the treatment liquid 6 stops ejection from the treatment liquid ejecting unit 11 and the liquid droppage while moving the treatment liquid ejecting unit 11 between the process position of the upper part of work 4 and the home position can be prevented. Moreover mutual contamination and occurrence of dust or corrosion in the vicinity of home position can be avoided in advance.

Here, the shape and roughness of the mesh 11D may be selected taking the specific gravity, viscosity, surface tension, or quantity of ejecting liquid, caliber of treatment liquid 6 to be used into consideration. Especially, the surface tension is very important the shape and roughness of the mesh 11D are selected so that the force to support liquid by the surface tension becomes larger than the force to drop by the weight of liquid from the valve to the treatment liquid ejecting unit 11.

Furthermore, since the mesh 11D is formed at the point of nozzle 11C, as compared with the case where a smaller quantity of liquid droppage occurs by using the nozzle with a small caliber, a large quantity of treatment liquid 6 can be ejected and the occurrence of mist can be avoided.

Furthermore, as compared with the case where liquid droppage stops well by making a plurality of holes on the side of nozzle for instance, a larger quantity of treatment liquid 6 can be ejected and the occurrence of mist can be avoided and the treatment liquid 6 is able to become a laminar flow.

Moreover, as compared with the case where a narrow slit is formed at the point of the box type nozzle, the construction of nozzle 11C itself can be simplified. As a result, since the weight of the treatment liquid ejecting unit 11 can be lightened, a driving mechanism for moving the treatment liquid ejecting unit 11 can be simplified and transfer of the treatment liquid ejecting unit 11 to the desired position can be conducted rapidly and with accuracy.

According to the foregoing construction, in the case where the liquid supplying apparatus 10 conducts the medical liquid treatment and washing treatment to the work 4, after transferring the treatment liquid ejecting unit 11 to the prescribed position of the upper part of the work 4, it ejects treatment liquid 6 to the work 4 rotated by the turntable 3.

At this point, the treatment liquid 6 which is temperature adjusted and filtered is supplied to the treatment liquid ejecting unit 11 through the liquid tank 16, the liquid sending pump 18 and the electromagnetic valve 20.

Furthermore, the liquid supplying apparatus 10 places the treatment liquid ejecting unit 11 on the home position where the cup 12 is installed during the waiting time prior to conducting these processes and at this point, the fixed amount of treatment liquids 6 is ejected from the treatment liquid ejecting unit 11.

The treatment liquid 6 is sent to the liquid tank 16 through the filter 14 and the liquid sending pump 15 in a state where it is received in the circulation cup 12 which is sealed hermetically and filled up with nitrogen gas so that the quality change does not occur. The treatment liquid, after temperature adjusted in the liquid tank 16, is supplied again to the treatment liquid ejecting unit 11 through the liquid sending pump 18, the filter 19 and the electromagnetic valve 20.

With this arrangement, since the point of the nozzle 11C does not dry during the waiting time in the liquid supplying apparatus 10, the occurrence of solids or the concentration change of treatment liquid 6 can be prevented.

Moreover, since the intrusion of oxygen, water, carbon dioxide, bacteria, and so forth, contained in the air from the point of the nozzle 11C can be prevented, the treatment liquid 6 can be prevented from being changed in quality and contaminated.

Furthermore, the circulated treatment liquid 6 is temperature adjusted during the waiting time, when it is necessary to adjust the treatment liquid 6 to a high temperature or a low temperature, the temperature change and/or approaching to the room temperature'during the waiting time can be prevented.

Moreover, since the treatment liquid 6 is constantly circulated during the waiting time, when the treatment liquid 6 is composed of pure water, multiplication of bacteria due to the flow stoppage of the treatment liquid 6 during the waiting time and mixing of impurities from the drain pipe can be prevented.

According to the foregoing construction, since by ejecting the fixed quantity of treatment liquid 6 from the treatment liquid ejecting unit 11 during the process waiting time and sending out the treatment liquid 6 to the liquid tank 16 through the cup 12 which is sealed airtight and to circulate, the treatment liquid 6 would not be wasted but the liquid supplying apparatus 10 capable of supplying the treatment liquid 6 having high quality can be realized.

Moreover, since the ejecting port of the nozzle 11 is formed in mesh shape, liquid droppage stopping capability of the nozzle 11C can be improved, and mutual pollution between processes in case of moving the nozzle 11C and the occurrence of dust and corrosion in the vicinity of home position of the nozzle 11C can be prevented.

Furthermore, the embodiment described above has dealt with the case of sealing the inside of circulation cup 12 airtight by installing the O-ring 11B on the flange 11A arranged in the treatment liquid ejecting unit 11. However, the present invention is not only limited to this, but also the O-ring can be installed on the side of circulation cup 12 and by attaching the O-ring and the flange 11A tightly, inside of the circulation cup can be sealed airtight. Moreover, other sealing materials can be used in place of the O-ring, however, the most important part is that the circulation cup 12 would be sealed airtight at the time when the treatment liquid ejecting unit 11 is moved to its home position.

Furthermore, the embodiment described above has dealt with the case where the fixed quantity of treatment liquids are being ejected constantly from the treatment liquid ejecting unit 11 on the home position. However, the present invention is not only limited to this, but also the treatment liquid 6 can be ejected just before the process depending on kind of the treatment liquid 6.

Furthermore, the embodiment described above has dealt with the case of applying the liquid supplying apparatus according to the present invention to the liquid supplying apparatus 10 which ejects the treatment liquid 6 by the treatment liquid ejecting unit 11 from the upper part of the work 4 rotated by the turntable 3. However, the present invention is not only limited to this, but also widely applicable to the case of supplying treatment liquid to the treatment liquid ejecting means which ejects treatment liquid to the original glass disc, semiconductor wafer, liquid crystal, etc., in the case of making the original optical disc.

Furthermore, the embodiment described above has dealt with the case of arranging the filter 14 between the circulation cup 12 and the liquid tank 16 and removing impurities contained in the treatment liquid by arranging the filter 19 between the liquid tank 16 and the treatment liquid ejecting unit 11. However, the filter 14 and/or the filter 19 can be omitted in the case where high quality treatment liquid can be obtained without the filers 14 and 19.

Furthermore, in the case where pure water is used and the treatment liquid must be kept running constantly extending the circulation line up to each installation of the production line starting from the central pure water manufacturing equipment of the production factory in order to maintain above the fixed quality, a drain pipe for reuse 13 can be connected to the return drain pipe to the pure water room. Moreover, in this case, pure water tank can be installed in or around the equipment, and filters and temperature controlling equipments can be attached to a small pump and can be circulated in the same manner.

According to the present invention as described above, in the liquid supplying apparatus for supplying the treatment liquid to the treatment liquid ejecting means which ejects the treatment liquid to the work to be treated, when the treatment liquid ejecting means is not ejecting treatment liquid to the work to be treated, a circulation means for circulating the treatment liquid to be ejected by the treatment liquid ejecting means and providing the liquid again to the treatment liquid ejecting means the treatment liquid is not wasted. This the liquid supplying apparatus capable of supplying the treatment liquid having high quality can be realized.

While preferred embodiments of the invention have been described, it will be obvious to those skilled in the art that various changes and modifications may be aimed, therefore, to cover in the appended claims all such changes and modifications as fall within the true spirit and scope of the invention.

What is claimed is:

1. A liquid supplying apparatus for supplying a treatment liquid to treatment liquid ejecting means which eject treatment liquid to a work to be treated, comprising:

a reservoir of said treatment liquid;

means for supplying said treatment liquid from said reservoir to said ejecting means; and circulation means for returning said treatment liquid ejected by said ejecting means to said reservoir when said ejecting means is not ejecting said treatment liquid to said work to be treated;

wherein said circulation means comprise a cup for receiving treatment liquid elected from said electing means; and further wherein said electing means are movable between a first position at which said treatment liquid is elected to said work and a second position at which said treatment liquid is elected into said cup;

said ejecting means comprising;

a nozzle for electing said treatment liquid, a flange extending sideward of said nozzle, and means for creating a seal between said cup and said flange when said electing means is in said second position.

2. The liquid supplying apparatus according to claim 1, wherein said circulating means comprise a filter to remove impurities in said treatment liquid between said cup and said reservoir.

3. The liquid supplying apparatus according to claim 1, wherein said seal is airtight.

4. The liquid supplying apparatus according to claim 3, wherein said airtight seal maintains an atmosphere inside said cup in isolation from an ambient atmosphere.

5. The liquid supplying apparatus according to claim 4, further comprising a pipe for supplying nitrogen gas into said cup.

6. The liquid supplying apparatus according to claim 1, further comprising a pipe for supplying nitrogen gas into said cup.

7. The liquid supplying apparatus according to claim 1, wherein said nozzle has an ejecting port to eject said treatment liquid, said port being formed in mesh shape.

8. The liquid supplying apparatus according to claim 1, further comprising a heater installed in said reservoir for controlling the temperature of said treatment liquid.

9. The liquid supplying apparatus according to claim 1, wherein said means for supplying comprise a filter for removing impurities from said treatment liquid.

10. The liquid supplying apparatus according to claim 1, wherein said means for supplying comprise a liquid sending pump.

11. The liquid supplying apparatus according to claim 1, wherein said circulation means comprise a liquid sending pump.

12. The liquid supplying apparatus according to claim 1, wherein said circulation means comprise a valve.

13. The liquid supplying apparatus according to claim 1, wherein said means for creating a seal comprise an O-ring.

14. A liquid supplying apparatus for supplying a treatment liquid to treatment liquid ejecting means which elect treatment liquid to a work to be treated, comprising:

a reservoir of said treatment liquid;

means for supplying said treatment liquid from said reservoir to said ejecting means; and circulation means for returning said treatment liquid ejected by said ejecting means to said reservoir when said ejecting means is not electing said treatment liquid to said work to be treated;

wherein said circulation means comprise a cup for receiving treatment liquid elected from said ejecting means; and further wherein said ejecting means are movable between a first position at which said treatment liquid is elected to said work and a second position at which said treatment liquid is ejected into said cup;

wherein said electing means have an ejecting port to eject said treatment liquid, said port being formed in mesh shape;

wherein said mesh shape of said ejecting port prevents dripping of said treatment liquid when said ejecting means moves between said first and second positions.

* * * * *